United States Patent [19]

Iwahashi et al.

[11] Patent Number: 4,477,884
[45] Date of Patent: Oct. 16, 1984

[54] SEMICONDUCTOR MEMORY WITH IMPROVED DATA PROGRAMMING TIME

[75] Inventors: Hiroshi Iwahashi, Yokohama; Masamichi Asano, Tokyo, both of Japan

[73] Assignee: Tokyo Shibaura Denki Kabushiki Kaisha, Kawasaki, Japan

[21] Appl. No.: 310,822

[22] Filed: Oct. 13, 1981

[30] Foreign Application Priority Data

Oct. 15, 1980 [JP] Japan ................................. 55-143947
Oct. 15, 1980 [JP] Japan ................................. 55-143948
Oct. 15, 1980 [JP] Japan ................................. 55-143949

[51] Int. Cl.³ .............................................. G11C 7/00
[52] U.S. Cl. ..................................... 365/189; 365/219
[58] Field of Search ................ 365/189, 218, 219, 220

[56] References Cited

U.S. PATENT DOCUMENTS 4,079,462  3/1978  Koo ..................................... 365/222
4,130,900 12/1978  Watanabe ............................ 365/189

FOREIGN PATENT DOCUMENTS 53-20825  2/1978  Japan .................................. 365/220
2053611   2/1981  United Kingdom .

Primary Examiner—George G. Stellar
Attorney, Agent, or Firm—Finnegan, Henderson, Farabow, Garrett & Dunner

[57] ABSTRACT

A semiconductor memory comprising a memory array having a plurality of memory cells, such as floating gate type MOS transistors, arranged in a matrix form with column lines and row lines, and a plurality of bit outputs. The plurality of column lines are associated with each bit output. A circuit is provided which applies a program voltage to a plurality of column lines corresponding to each bit output in response to address signals or control signals. A plurality of memory cells corresponding to each bit output are programmed simultaneously by the circuit.

9 Claims, 14 Drawing Figures

SEMICONDUCTOR MEMORY WITH IMPROVED DATA PROGRAMMING TIME

BACKGROUND OF THE INVENTION

The present invention relates to a semiconductor memory and, more particularly, a nonvolatile semiconductor memory using, as memory cells, field effect transistors each including a floating gate within a gate insulating film.

In a nonvolatile semiconductor memory such as an erasable and electrically programmable read only memory (EPROM) using field effect transistors each having a floating gate within an insulating film to program a memory cell, that is, to inject electrons into the floating gate, a program voltage (e.g. 25 V) is simultaneously applied to the gate and drain of a memory insulating gate field effect transistor. Usually, about 50 milliseconds are taken to program a single memory cell. In this case, the programming is performed every word. Accordingly, about 1.7 minutes are taken to program all the memory cells of a memory of 2048 words×8 bits, and about 3.4 minutes for a memory of 4096 words×8 bits.

In the die sort process of semiconductor memories, all the dies on a single wafer are tested as to whether all the memory cells can be programmed or not. In the case of the memory of 4096 words×8 bits, if 150 dies, for example, fabricated on a single wafer, the time taken for the programming test of all of the dies is 3.4 minutes×150=510 minutes, or 8.5 hours.

The same thing can be said for actual data programming of semiconductor memories. A long programming time is taken for programming memories word by word.

SUMMARY OF THE INVENTION

Accordingly, an object of the present invention is to provide a nonvolatile semiconductor memory which simultaneously programs a plurality of memory cells with different addresses to thereby reduce a data programming time.

A semiconductor memory according to the present invention comprises a memory array including plurality of memory cells, such as floating-gate type MOS transistors, arranged in a matrix form having column lines and row lines and a plurality of bit outputs. Each bit output is associated with a plurality of column lines. To the memory array is connected a row decoder and a column decoder for selecting a plurality of memory cells for one word.

According to one embodiment of the present invention, a circuit is provided which responds to a control signal or signals to simultaneously apply a program voltage to a plurality of column lines corresponding to 1-bit output so that memory cells of different addresses are simultaneously programmed.

According to a second embodiment, the column lines associated with each output bit are divided into a plurality of groups. One of the column lines in each of the column line groups is selected by the column decoder. A data input circuit applies a program voltage to a plurality of column lines corresponding to one bit output selected by the column decoder in response to in-phase address signals. As a result, a plurality of memory cells connected with one row line selected by the row decoder and the column lines to which the program voltage is applied are simultaneously programmed.

According to a third embodiment of the present invention, the memory array is divided into a plurality of memory array blocks. One of the memory array blocks is selected by address signals. In a simultaneous data write mode, a pair of address signals is made in-phase by a control signal, so that a plurality of memory array blocks is selected and memory cells addressed by decoders, in each of the selected memory blocks, are simultaneously programmed.

According to a fourth embodiment of the present invention, a plurality of column lines associated with each bit output in the memory array is divided into a plurality of groups. One of the column lines of each of the column line groups is connected to an output of the column decoder. Each column line group is connected through a switch element to a program power source. A data input circuit, to which input data having more than two voltage levels is applied, controls the switching elements on the basis of a voltage level of the input data applied, so that data 1 and/or data 0 is written into a plurality of memory cells associated with each bit output and selected by column and row decoders.

DETAILED DESCRIPTION OF THE PREFERRED EMBODIMENTS

Figure 1:
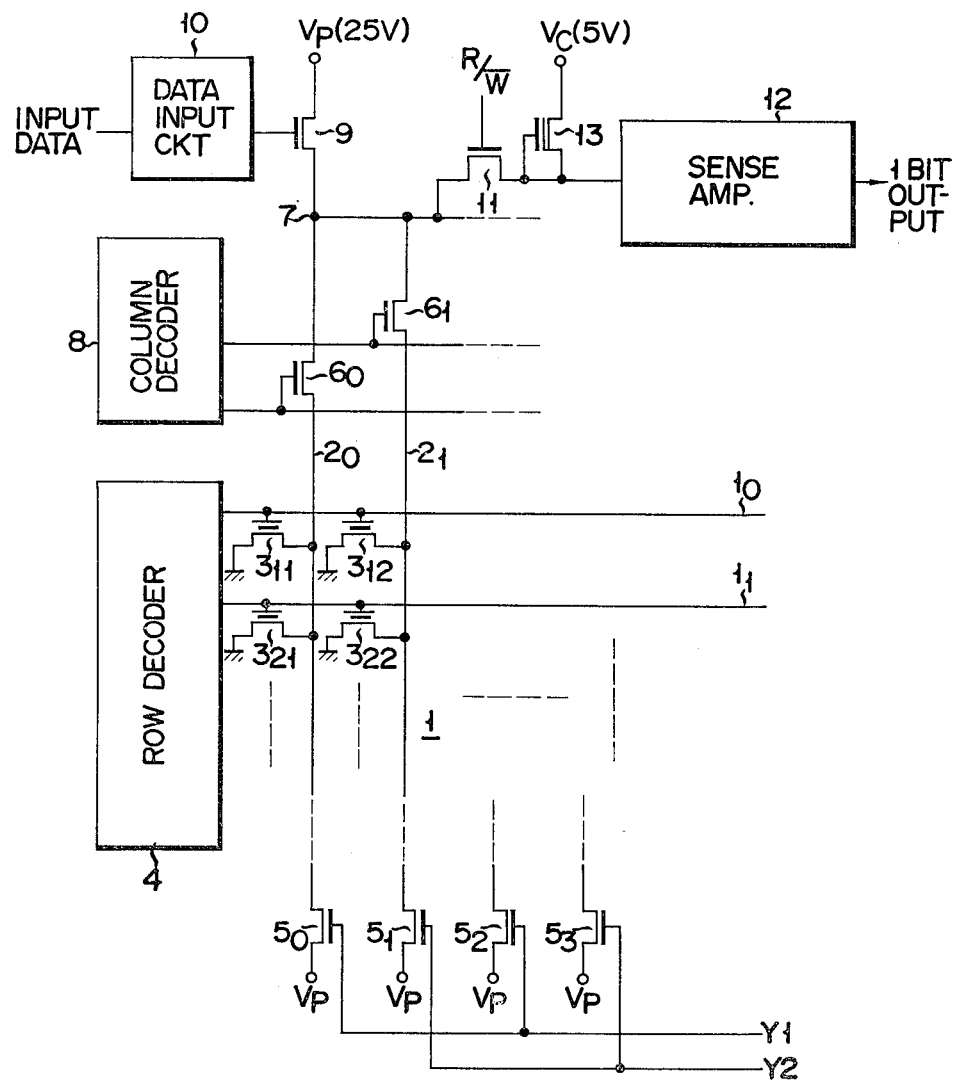
FIG. 1 schematically shows a nonvolatile memory according to an embodiment of the present invention.

Referring to FIG. 1, there is shown a nonvolatile semiconductor memory according to an embodiment of the present invention which comprises a memory array 1 having row lines $1_0$, $1_1$, ..., column lines $2_0$, $2_1$, ..., and floating gate type MOS transistors $3_{11}$, $3_{12}$, ..., $3_{21}$, $3_{22}$, ... acting as memory cells. The MOS transistors have their sources grounded, their drains connected to corresponding column lines, and their gates connected with corresponding row lines.

The row lines $1_0, 1_1, \ldots$ are connected to a row (x) decoder 4. Ends of the column lines $2_0, 2_1, \ldots$ are connected with a power source of program voltage Vp via insulating-gate field effect transistors (IGFET) $5_0, 5_1, 5_2, 5_3, \ldots$. The other ends of the column lines are coupled with a common terminal 7 by way of column selecting IGFET's $6_0, 6_1, \ldots$. Gates of the IGFET's $5_0, 5_2, \ldots$, are supplied with a gate signal Y1, while gates of the IGFET's $5_1, 5_3, \ldots$, are supplied with a gate signal Y2. Gates of the IGFET's $6_0, 6_1, \ldots$ are connected with the corresponding outputs (column selecting lines) of a column decoder 8. The common terminal 7 is coupled with the source of program voltage Vp through an IGFET 9 having its gate coupled with the output of a data input circuit 10 supplied with input data. The common terminal 7 is connected to a sense amplifier/output buffer circuit 12 through an IGFET 11 supplied with a data readout instruction signal R/$\overline{W}$ at its gate. The input terminal of sense amplifier 12 is connected with a power source Vc (5 V, for example) via a depletion mode IGFET 13 having its gate connected with the input of sense amplifier 12.

The sense amplifier 12 provides a 1 bit output. When one word stored in the memory consists of 4 bits, or the memory has 4 bit outputs, four sense amplifiers are provided. The same thing is true for the data input circuit 10.

In order to examine whether all of the memory cells of the nonvolatile memory can be written or not, the IGFET's $5_0, 5_1, 5_2, 5_3, \ldots$, are turned on by raising the levels of gate signals Y1 and Y2 up to the program voltage Vp. As a result, the program voltage Vp is applied to all the column lines. Under this condition, when the levels of row lines $1_0, 1_1, \ldots$ are successively raised to the level of the program voltage Vp by row decoder 4, the gates and drains of the floating-gate IGFET's connected with each row line are supplied with voltages Vp and (Vp−Vth), respectively, so that memory transistors are programmed. Vth represents a threshold voltage of each of IGFET's $5_0, 5_1, 5_2, 5_3, \ldots$.

As described above, with this memory, since all of the memory cells connected to the respective row lines are programmed simultaneously, a program test time is remarkably reduced compared with a conventional memory. The memory cells are not only simultaneously programmed but also supplied with program data at the same time. Namely, this obviates the necessity of a special circuit for simultaneous data programming such as a latch circuit.

Alternatively, the gate signals Y1 and Y2 may be alternately raised to the program voltage Vp such that the gate signal Y1 is raised when row line $1_0$ is selected and the gate signal Y2 is raised when the row line $1_1$ is selected. In this case, data 1 is written into alternate memory cells connected to each row line, and data 0 is written into the remaining memory cells. In this case, data 1 represents a state that electrons are not injected into the floating gate of memory cell, while data 0 represents a state that electrons have been injected into the floating gate. It is to be understood that the gate signals Y1 and Y2 are raised up to the program voltage Vp only during the test process of memory devices, and therefore the gate signals are zero volt during a formal data programming time.

Figure 2:
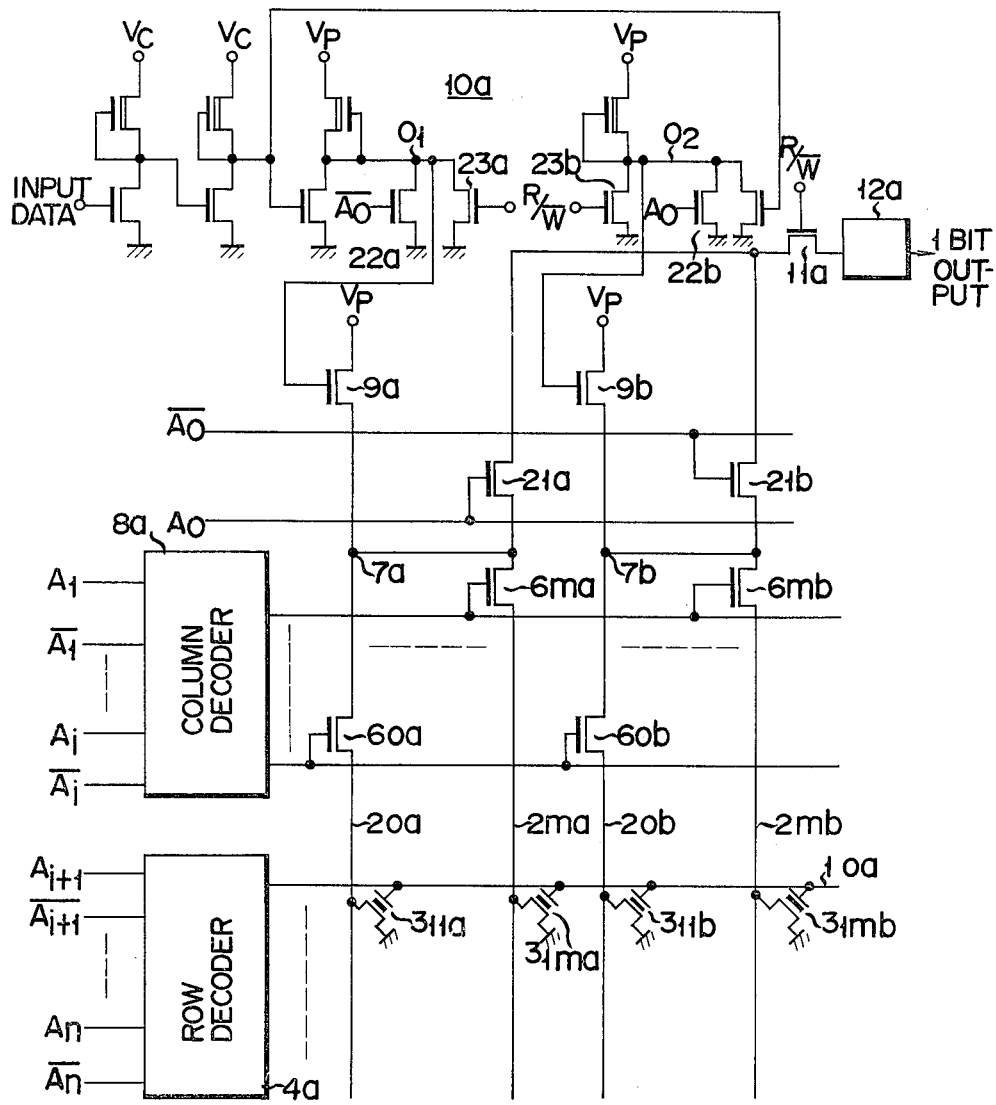
FIG. 2 schematically shows a nonvolatile memory according to another embodiment of the present invention.

FIG. 2 shows another embodiment of a nonvolatile semiconductor memory of the present invention. With this embodiment, by making a pair of column selecting address signals in-phase, the program voltage Vp is simultaneously applied to two of the column lines for one output bit which are selected by the column decoder so that a couple of memory cells connected to a row line selected by the row decoder are simultaneously programmed.

As shown in FIG. 2, in this embodiment, a pair of common terminals 7a and 7b are provided which are coupled to the program voltage Vp through IGFET's 9a and 9b. The common terminals 7a and 7b are connected to a data readout FET 11a followed by sense amplifier 12a, by way of IGFET's 21a and 21b supplied with address signals A0 and $\overline{A0}$, respectively. Further, common terminal 7a is coupled with column lines $2_{0a}$ to $2_{ma}$ via column selecting FET's $6_{0a}$ to $6_{ma}$, gates of which are connected to the outputs of column decoder 8a, respectively. The common terminal 7b is connected with column lines $2_{0b}$ to $2_{mb}$ by way of column selecting FET's $6_{0b}$ to $6_{mb}$, having gates connected with the outputs of column decoder 8a, respectively.

Column lines $2_{0a}$ to $2_{ma}$ and $2_{0b}$ to $2_{mb}$ are connected to drains of floating-gate FET's $3_{1la}$ to $3_{1ma}$ and $3_{1lb}$ to $3_{1mb}$. Gates to IGFET's 9a and 9b are respectively connected to output terminals $0_1$ and $0_2$ of data input circuit 10a. Output terminal $0_1$ is grounded through an IGFET 22a and an IGFET 23a. The gate of IGFET 22a is supplied with address signal $\overline{A0}$, and the gate of IGFET 23a is supplied with an R/$\overline{W}$ signal. On the other hand, output terminal $0_2$ is grounded through an IGFET 22b and an IGFET 23b. The gate of IGFET 22b is supplied with address signal A0 and the gate of IGFET 23b is supplied with R/$\overline{W}$ signal.

In the memory arranged as above, in order to write data into memory cells for a program test, the address input signals A0 and $\overline{A0}$ and the R/$\overline{W}$ signal are set at logic 0 level. As a result, IGFET's 11a, 21a, 21b, 22a, 22b, 23a and 23b are turned off. Under this condition, when logic 0 data is applied to data input circuit 10a, output terminals $0_1$ and $0_2$ go to the logic 1 level (in this case, Vp level), to turn ON IGFET's 9a and 9b. This means that program data is simultaneously applied to two memory cells. As a result, common terminals 7a and 7b are connected with the program voltage Vp, so that the program voltage Vp is applied to a pair of the column lines selected by column decoder 8a. This implies that a couple of memory cells connected to the selected column lines and the row line selected by row decoder 4a are programmed simultaneously. For example, in FIG. 2, either a pair of memory cells $3_{1la}$ and $3_{1lb}$ or $3_{1ma}$ and $3_{1mb}$ is simultaneously programmed. Thus, in the memory shown in FIG. 2, the program test time is halved compared with the prior art memory. As stated above, the requirement of a data latch circuit for data programming is obviated.

In FIG. 2, in order to write memory cells formally, address signals A0 and $\overline{A0}$ are set in a complementary relation. For example, when A0=1 and $\overline{A0}$=0, IGFET 22b is ON. Therefore, output terminal $0_2$ is at substantially ground level, and the IGFET 9b is OFF. Meanwhile, depending on input data, output terminal $0_1$ goes to logic 1 level or logic 0 level. Consequently, one memory cell selected by row decoder 4a and column decoder 8a is written with data of 0 or 1. In this case, data 1 corresponds to logic 1 of input data. At this time, the terminal $0_1$ is at logic 0 level and transistor 9a remains off. Namely, writing data 1 into a memory cell means that the floating-gate of memory cell is neutral.

Figure 3:
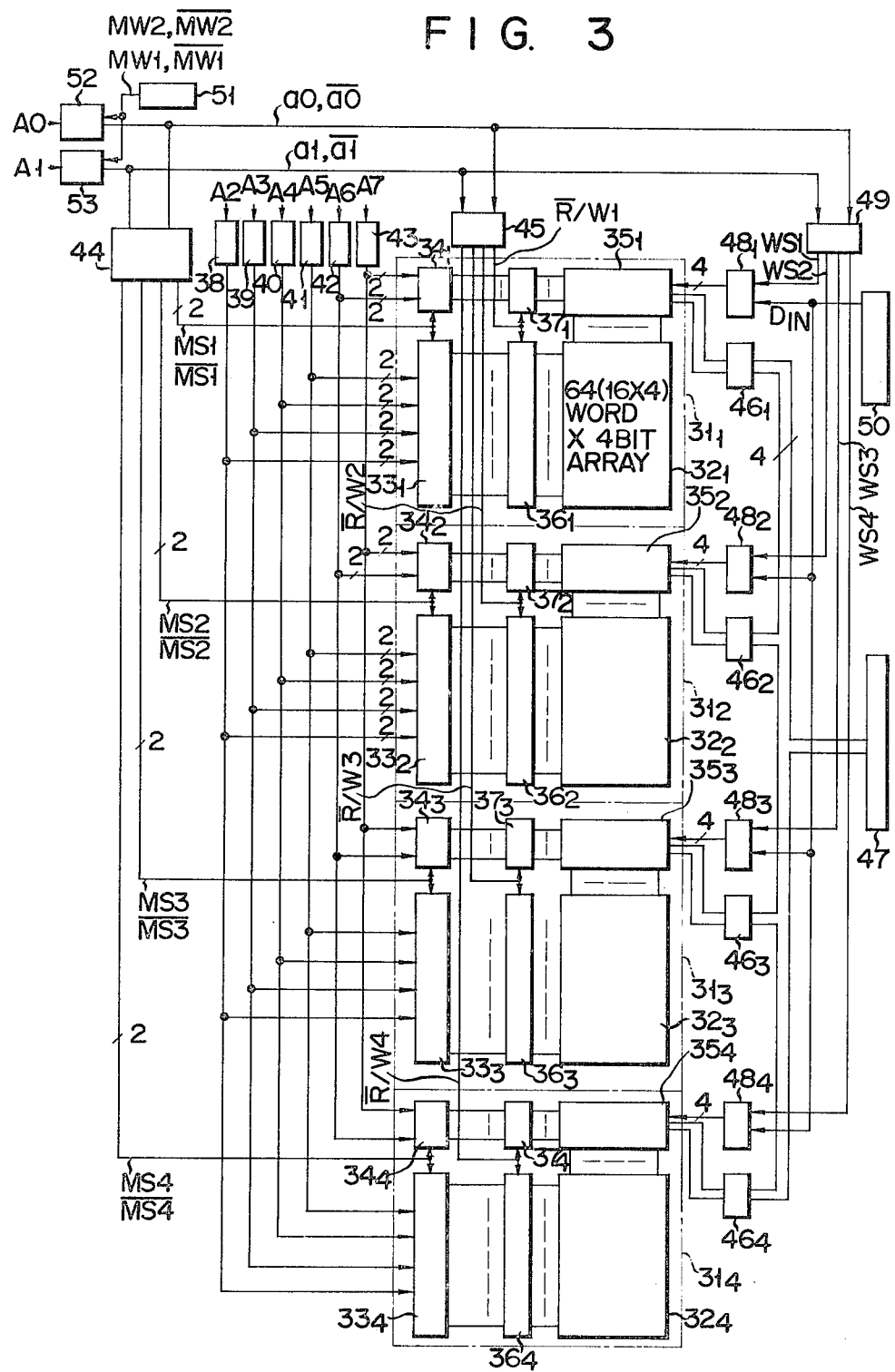
FIG. 3 illustrates a nonvolatile memory according to still another embodiment of the present invention.

FIG. 3 shows yet another embodiment of a nonvolatile semiconductor memory of the present invention. In this embodiment, the memory array is divided into four blocks. And the corresponding memory cells in four or two memory blocks (16 or 8 cells when a word consists of 4 bits) are simultaneously programmed.

In FIG. 3, reference numerals $31_1$ to $31_4$ designate the memory blocks. These memory blocks include respectively memory arrays $32_1$ to $32_4$, row decoders $33_1$ to $33_4$, column decoder $34_1$ to $34_4$, column selecting gate circuits $35_1$ to $35_4$, write load circuits $36_1$ to $36_4$ and write load circuit $37_1$ to $37_4$. In this embodiment, memory arrays $32_1$ to $32_4$ are each a 64 (16×4) word by 4 bit array.

Address signals A2 to A5 are applied to each of row decoders $33_1$ to $33_4$ via address buffers 38 to 41, respectively, while address signals A6 and A7 are applied to each of column decoders $34_1$ to $34_4$ by way of address buffers 42 and 43.

Selection of the memory blocks $31_1$ to $31_4$ is performed by output signals MS1, $\overline{MS1}$ to MS4 and $\overline{MS4}$ of a memory block selecting circuit 44 fed with address signals A0 and A1. Write load circuits $36_1$ to $36_4$ and $37_1$ to $37_4$ are selectively enabled by output signals $\overline{R/W1}$, $\overline{R/W2}$, $\overline{R/W3}$ and $\overline{R/W4}$ of a load-circuit selecting circuit 45 supplied with address signals A0 and A1.

The 4-bit outputs of each of memory blocks $31_1$ to $31_4$ are coupled together with an output circuit 47 via transmission gate circuits $46_1$ to $46_4$. To memory blocks $31_1$ to $31_4$ are connected write circuits $48_1$ to $48_4$ which are selectively enabled by output signals WS1 to WS4 of write-circuit selecting circuit 49.

Circuits $48_1$ to $48_4$ each supply input data Din from an input circuit 50 to the corresponding memory block when enabled. A multiple-write circuit designated by reference numeral 51 is arranged to supply signals MW1 (MW2) and $\overline{MW1}$ ($\overline{MW2}$) to address buffers 52 and 53. The address signals A0 and A1 are supplied to buffers 52 and 53 in order to set the address signals to the multiple write mode in which a plurality of memory blocks are selected and a plurality of memory cells in the selected memory blocks are concurrently programmed.

Figure 4:
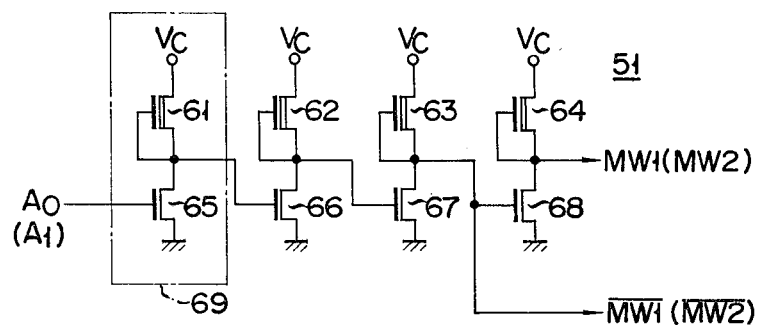
FIG. 4 shows a practical arrangement of a multiple-write switching circuit used in the memory shown in FIG. 3.

FIG. 4 shows a practical arrangement of multiple-write circuit 51. Reference numerals 61 to 64 designate depletion mode IGFET's and reference numerals 65 to 68 enhancement mode IGFET's. Address signal A0 (or A1) is applied to an inverter 69 for detecting an input voltage of 10 V or more as a logic 1. When the address signal A0 is raised to 10 V or more for multiple writing, the output signal MW1 (MW2) goes to logic 1 level, while the output signal $\overline{MW1}$ ($\overline{MW2}$) goes to logic 0 level, thus instructing address buffers 52 and 53 to execute the multiple-write. In the normal write mode, the address signal A0 (A1) is below 10 V. Under this condition, the output signal MW1 (MW2) is at logic 0 level, while the output signal ($\overline{MW1}$) ($\overline{MW2}$) is at logic 1 level.

Figure 5:
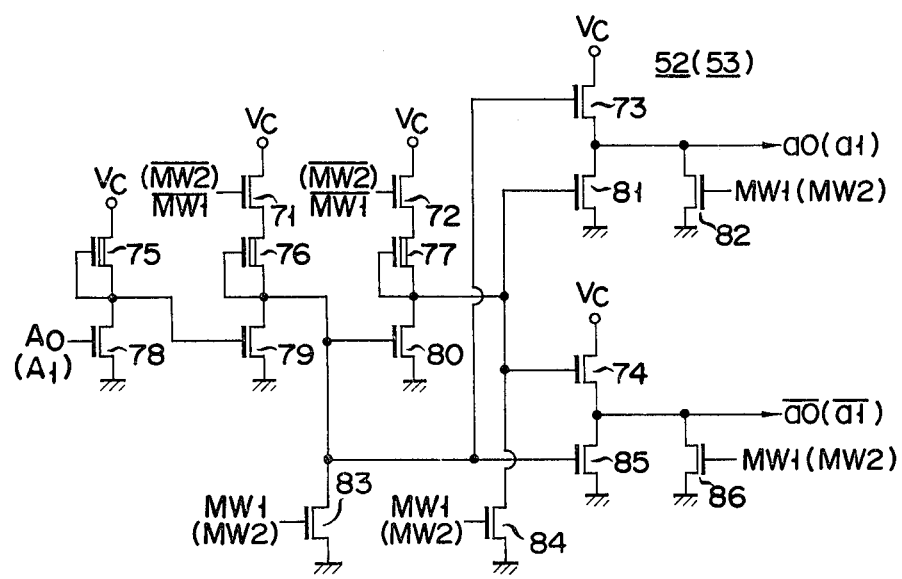
FIG. 5 shows a practical arrangement of an address buffer circuit controlled by the multiple-write switching circuit in FIG. 3.

FIG. 5 shows a practical arrangement of the address buffer 52 (or 53). Reference numerals 71 to 74 designate IGFET's the threshold voltage of which is 0 V; reference numerals 75 to 77 depletion mode IGFET's; 78 to 86 enhancement mode IGFET's. In the normal data write mode, the output signals MW1 (MW2) and $\overline{MW1}$ ($\overline{MW2}$) of multiple-write circuit 51 are respectively at logic 0 and logic 1 level. Therefore, output signals a0 (a1) and $\overline{a0}$ ($\overline{a1}$) of address buffer 52 (53) are at complementary logic levels according to the logic level of the address signal A0 (A1). However, when MW1 (MW2)=1 and $\overline{MW1}$ ($\overline{MW2}$)=0, that is, in the multiple-write mode, the output signals a0 (a1) and $\overline{a0}$ ($\overline{a1}$) of address buffer circuit 52 (53) both go to logic 0.

The address buffer circuits shown in FIGS. 4 and 5 can be used in the memories shown in FIGS. 1 and 2. If the address buffer circuit is used for address input signals to the row decoder, then a plurality of row lines can be selected concurrently so that memory cells connected to the plurality of row lines are programmed at the same time. This means, as stated above, that program data are simultaneously applied to the memory cells. For programming test, data applied to the memory cells may be identical to each other.

Figure 6:
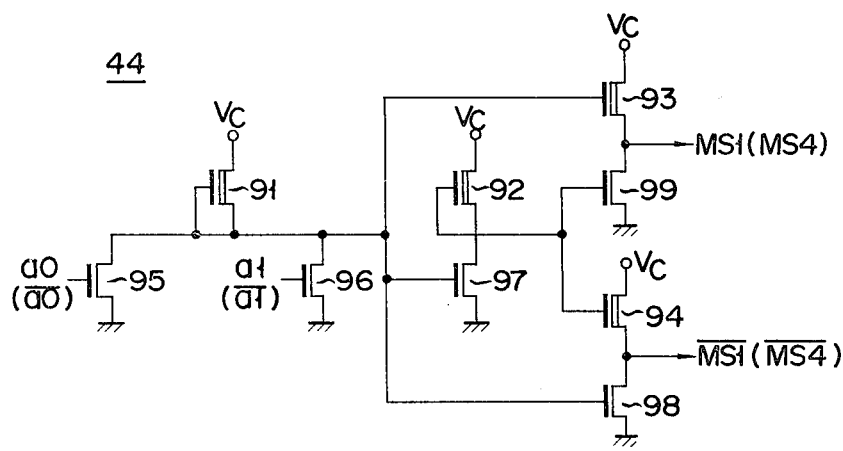
FIG. 6 shows a practical arrangement of a memory block selecting circuit in FIG. 3.

FIG. 6 shows a practical arrangement of memory block selecting circuit 44. Reference numerals 91 to 94 designate depletion mode IGFET's and numerals 95 to 99 enhancement mode IGFET's. This circuit is provided for each of combinations of the output signals from address buffers 52 and 53; a0 and a1, a0 and $\overline{a1}$; a0 and a1, and $\overline{a0}$ and $\overline{a1}$.

The circuit shown in FIG. 6, for example, receives the output signals a0 ($\overline{a0}$) and a1 ($\overline{a1}$) from address buffers 52 and 53 to form output signals MS1 (MS4) and $\overline{MS1}$ ($\overline{MS4}$). In the normal data write or read mode, one of the output signals MS1 to MS4 for selecting a memory block designated is at logic 1 level and corresponding one of the signals $\overline{MS1}$ to $\overline{MS4}$ is at logic 0 level. In the multiple-write mode, the signals a0, $\overline{a0}$, a1, and $\overline{a1}$ are at logic 0, and hence the signals MS1 to MS4 are all at logic 1, while signals $\overline{MS1}$ to $\overline{MS4}$ are all at logic 0. As a result, memory blocks $32_1$ to $32_4$ are all selected.

Figure 7:
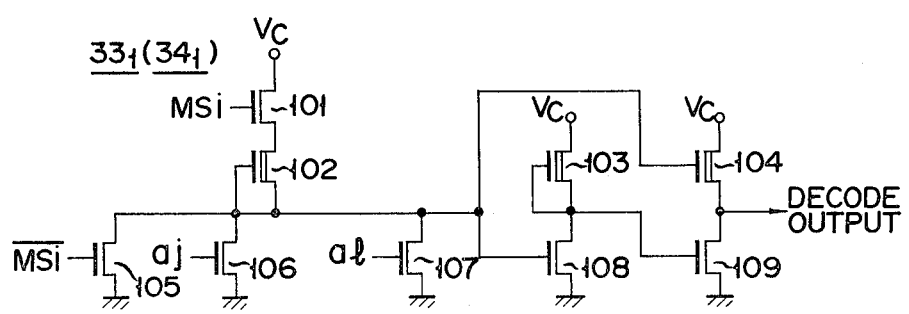
FIG. 7 illustrates a practical arrangement of row and column decoders in FIG. 3.

FIG. 7 shows a practical arrangement of the row (column) decoder. Reference numeral 101 designates an IGFET the threshold voltage of which is approximately 0 V; numerals 102 to 104 depletion mode IGFET's; and numerals 105 to 109 enhancement mode IGFET's. In the case of the row decoder, for example, this circuit is provided for each of 16 combinations of the address input signals. On the other hand, in the case of the column decoder, this circuit is provided for each of four combinations of the address input signals.

In the normal operation, since MSi=1 and $\overline{MSi}$=0 ($1 \leq i \leq 4$) in the selected memory block, the decode outputs, or the row or column selecting lines, take a logical state according to address signals. In the non-selected memory block, MSi=0 and $\overline{MSi}$=1. Accordingly, the decode output goes to logic 0 regardless of a state of the address signals. In the multiple-write mode, as stated above, the signals MS1 to MS4 are all at logic 1 and the signals $\overline{MS1}$ to $\overline{MS4}$ are all at logic 0, so that all of the memory blocks $32_1$ to $32_4$ are selected.

Figure 8:
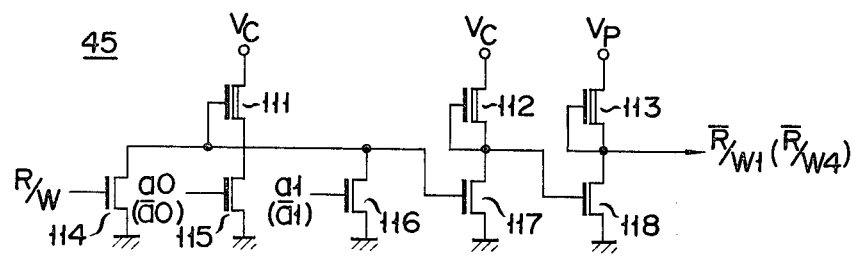
FIG. 8 shows a practical arrangement of a selecting circuit for write-load circuits in FIG. 3.

FIG. 8 shows a practical arrangement of the selecting circuit 45 for the write load circuits. Reference numerals 111 to 113 designate depletion mode IGFET's and numerals 115 to 118 enhancement mode IGFET's. This circuit is provided for each memory block. When R/W=0, that is, in the data write mode, it supplies a signal $\overline{R/Wi}$ of logic 1 to the write load circuit of a selected memory block.

Figure 9:
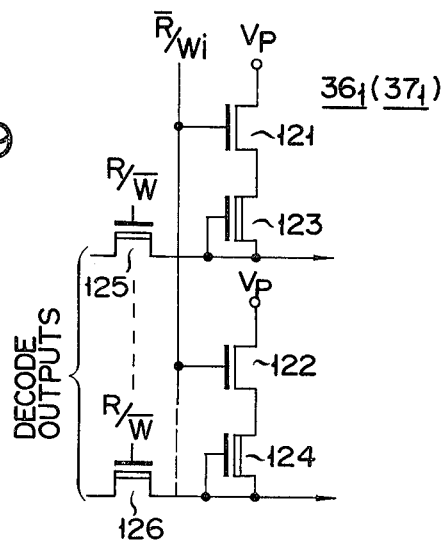
FIG. 9 shows a practical arrangement of the write-load circuits in FIG. 3.

FIG. 9 shows a practical arrangement of the write load circuit. Reference numerals 121 and 122 designate enhancement mode IGFET's and numerals 123 to 126 depletion mode IGFET's. With such a circuit arrangement, when $\overline{R/Wi}$=1, a selected decode output is raised to Vp level and the non-selected decode outputs go to logic 0 level.

Write-circuit selecting circuit 49 is constructed substantially similar to memory block selecting circuit 44. Accordingly, it may be considered that WS1=MS1, WS2=MS2, WS3=MS3 and WS4=MS4.

Figure 10:
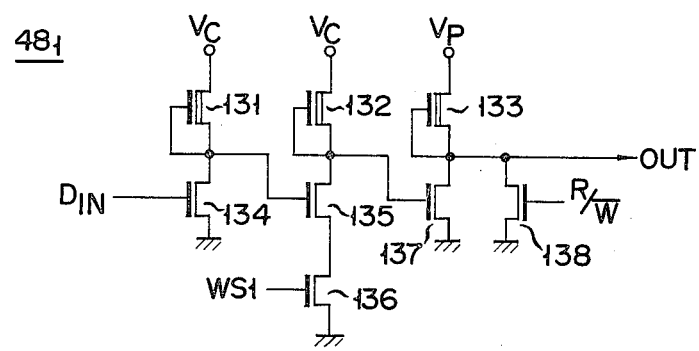
FIG. 10 shows a practical arrangement of a data-write circuit in FIG. 3.

FIG. 10 shows a practical arrangement of the write circuit 48₁. In the circuit, reference numerals 123 to 133 designate depletion mode IGFET's and numerals 134 to 138 enhancement mode IGFET's. When DIN =1, WS1=1, and $R/\overline{W}=0$, the output of this circuit goes to Vp to turn on an IGFET (corresponding to IGFET 9 in FIG. 1) which supplies a program voltage to the column lines. The remaining write circuits 48₂ to 48₄ are also constructed similarly. In these circuits, the signals WS2, WS3 and SW4 are supplied to the FET's corresponding to FET 136.

The memory thus constructed can simultaneously program a memory array of four memory blocks, so that a program test time is reduced to ¼ that of the prior art memory.

With this embodiment, if the address signals A0 and A1 are simultaneously set in the multiple-write mode, four memory blocks are simultaneously selected. Alternatively, one of the address signals A0 and A1 may be set in the multiple-write mode. In this case, two memory blocks are simultaneously selected. A common multiple-write switching circuit may be provided for address buffers 52 and 53. In this case, four memory blocks are simultaneously selected. For the purpose of program testing, the same data may be written into memory cells so that they are simultaneously programmed. In the above-mentioned embodiment, the address signal is used for the multiple-write switching signal, but other signals may be used instead. A terminal (pad) exclusively used for the program test may be provided to which a multiple-write switching signal is supplied.

Figure 11:
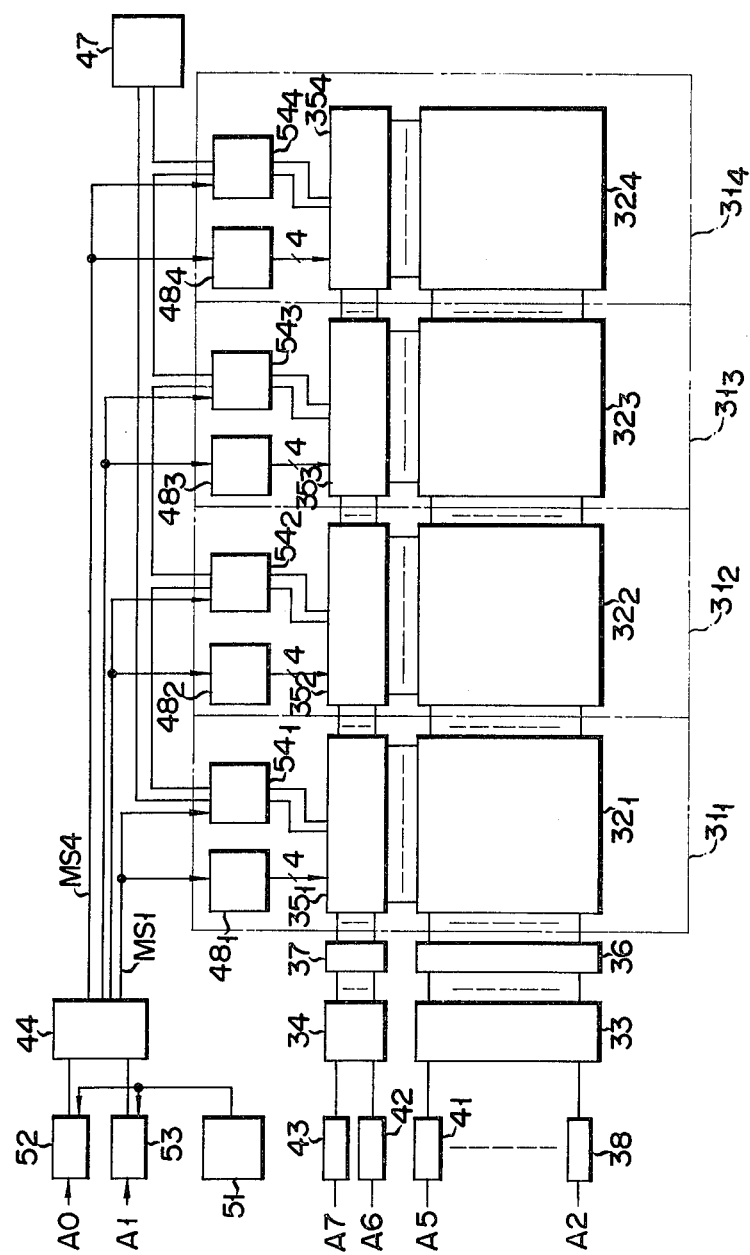
FIG. 11 shows a modification of the memory in FIG. 3.

FIG. 11 shows a modification of the memory of FIG. 3 in which row and column decoders are used commonly for the memory blocks. Outputs of row selecting gate circuits 35₁ to 35₄ are coupled to an output circuit 47 through sense amplifiers 54₁ to 54₄. In the normal operation mode, the memory block selecting circuit 44 selects one of the memory blocks so that the write circuit and the sense amplifier in the memory block are enabled. In the multiple-write mode, the write circuits are all enabled to write data into memory cells, selected by row and column decoders 33 and 34, in the memory arrays 32₁ to 32₄. In the memory shown in FIG. 11, memory blocks 31₁ to 31₄ and output circuit 47 each are arranged to have 4 bit outputs. However, they may have 1 bit output. With a 4-bit output memory device, if memory blocks 31₁ to 31₄ and output circuit 47 each have 1 bit output, then four-memory block unit and output circuit are further necessitated.

Figure 12:
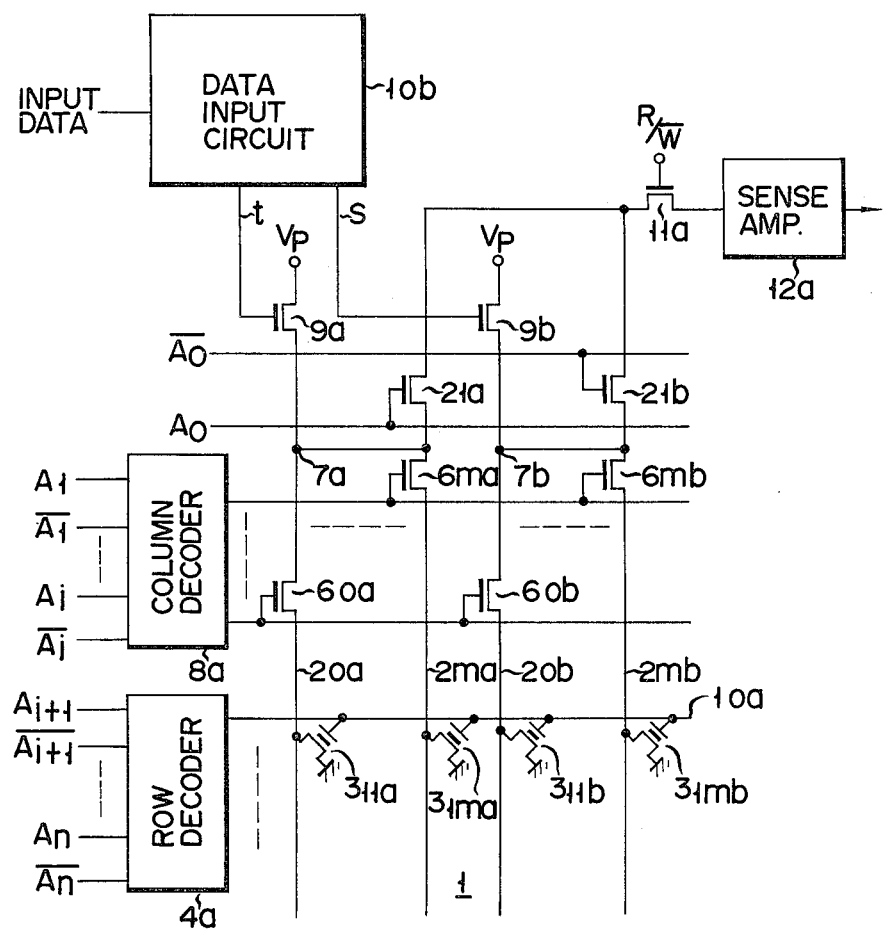
FIG. 12 schematically shows a memory according to still another embodiment of the present invention.

FIG. 12 shows still another embodiment of a nonvolatile semiconductor memory according to the present invention. This circuit is different from the circuit of FIG. 2 with respect to only data input circuit. Accordingly, like numerals are used for like portions in FIG. 2. In this embodiment, a plurality of column lines associated with one output bit are divided into a plurality of groups. Data 1 and/or 0 are written into memory cells which are connected to corresponding column lines in the groups selected by the column decoder and a row line selected by the row decoder, for the purpose of the data programming. The contents of data written into the memory cells are determined by a data input circuit 10b which detects a voltage level of the input data having more than 2 voltage levels. The present embodiment is suitable for the program test and the normal data programming as well.

An input data voltage applied to data input circuit 10b is set at 0 V, 5 V, 10 V or 15 V. Relationships between logic levels of outputs s and t of data input circuit 10b and input data voltage are shown in Table 1 given below.

TABLE 1

| Input data | s | t |
|---|---|---|
| 0 V | 0 | 0 |
| 5 V | 1 | 0 |
| 10 V | 0 | 1 |
| 15 V | 1 | 1 |

The logic 1 level of output s and t indicates the program voltage Vp (25 V), while the logic 0 level indicates 0 V.

When the input data is at 0 V, the outputs s and t of data input circuit 10b are at logic 0 level. Therefore, FET's 9a and 9b are OFF. As a result, the program voltage Vp is not applied to the column lines, and the contents of the memory cells remain zero. In this case, logic 0 corresponds to the neutral state of floating-gate. In other words, the logic 0 data is written into a memory cell, in each column line group, selected by row decoder and column decoder.

When the input data is at 5 V, since s=1 and t=0, FET 9b turns on. At this time, if the row line 1oa and the column line 2ob are selected by decoders 4a and 8a, logic 1 data is written into memory cell 3₁₁b. Since FET 9a remains off, the content of memory cell 3₁₁a remains zero. In other words, zero is written into memory cell 3₁₁a.

When the input data is at 10 V, since s=0 and t=1, FET 9a turns on. At this time, if memory cells 3₁₁a and 3₁₁b are selected by row decoder 4a and column decoder 8a, logic 1 data is written into memory cell 3₁₁a. When the input data is at 15 V, since s=1 and t=1, both FET's 9a and 9b turn on. If memory cells 3₁₁a and 3₁₁b are selected, logic 1 data is simultaneously written into these memory cells.

Figure 13:
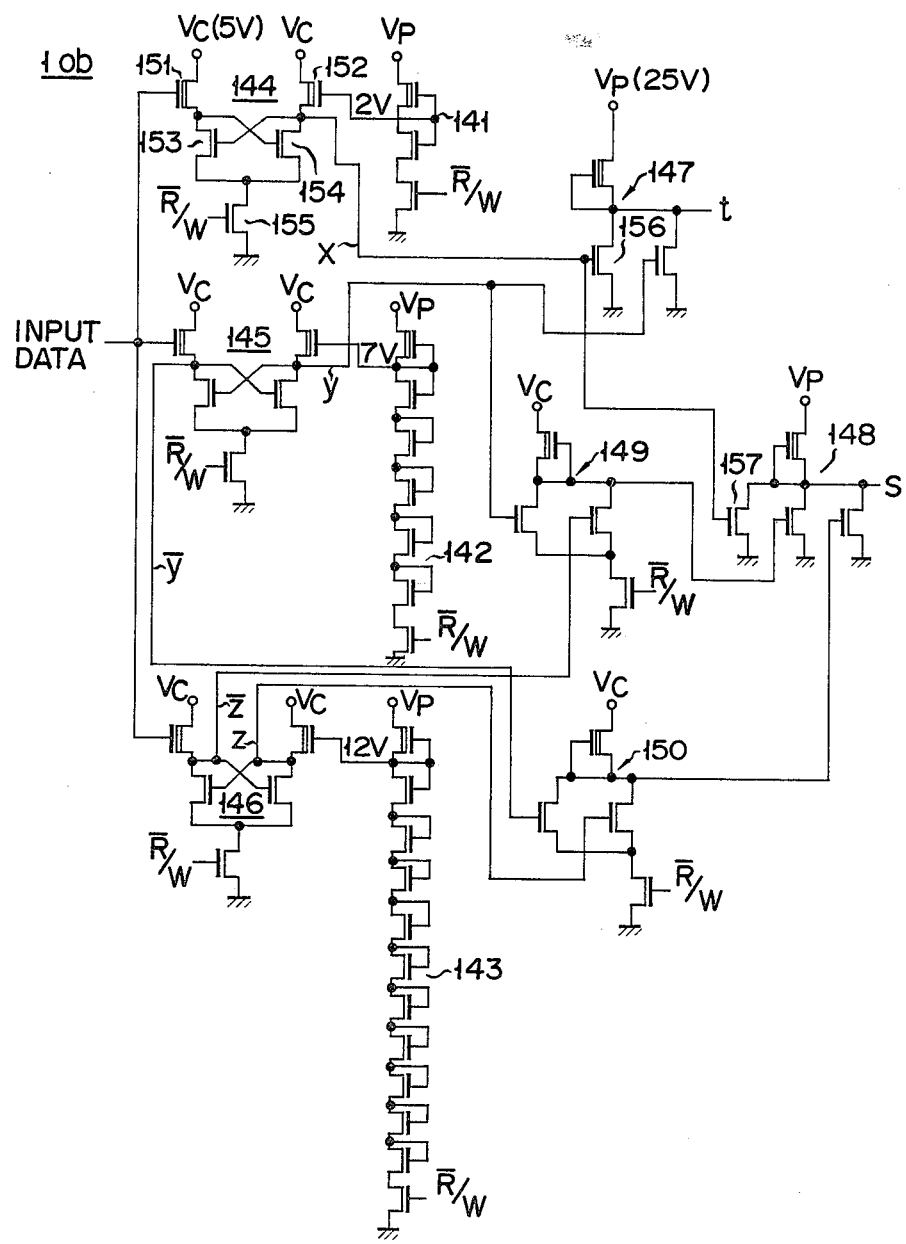
FIGS. 13 and 14 show practical arrangements of a data input circuit in FIG. 12.

In FIG. 13, a practical arrangement of the data input circuit for executing logic functions shown in the Table 1 is illustrated.

In Table 2, logic levels of outputs s and t of the circuit and at points of X, Y and Z are tabulated. The logic 1 level at points X, Y and Z indicates a voltage Vc (5 V, for example), and the logic 1 level of outputs s and t represents the program voltage Vp.

TABLE 2

| Input data | x | y | z | s | t |
|---|---|---|---|---|---|
| 0 V | 1 | 1 | 1 | 0 | 0 |
| 5 V | 0 | 1 | 1 | 1 | 0 |
| 10 V | 0 | 0 | 1 | 0 | 1 |
| 15 V | 0 | 0 | 0 | 1 | 1 |

In the circuit shown in FIG. 13, reference numerals 141, 142 and 143 designate reference voltage generating circuits which are enabled by the signal $\overline{R/W}$ to generate reference voltages of 2 V, 7 V and 12 V, respectively. The reference voltages 2 V, 7 V and 12 V are compared with the voltage of input data by voltage comparators 144, 145 and 146, respectively. On the basis of the result of the voltage comparison, gate circuits 147 to 150 are controlled to determine the logic levels at outputs s and t.

For example, if the input data is at 0 V, a resistance value of an FET 151 supplied with the input data at its gate is larger than a resistance value of an FET 152 supplied with the reference voltage of 2 V at its gate. Therefore, an FET 153 is ON while an FET 154 is OFF. And when an FET 155 is enabled by the write instruction signal $\overline{R/W}$ of logic 1, an output x of voltage comparator 144 goes to logic 1. As a result, FET's 156 and 157 of gate circuit 147 and 148 turn on to cause the outputs s and t to go to logic 0 level, as shown in Table 2. Also, in case that the input data is at another voltage level, a logic operation is performed according to Table 2. As will be evident, by changing the voltage of input data according to a comination of write-data to memory cells, the program data can be simultaneously written into the memory cells.

Figure 14:
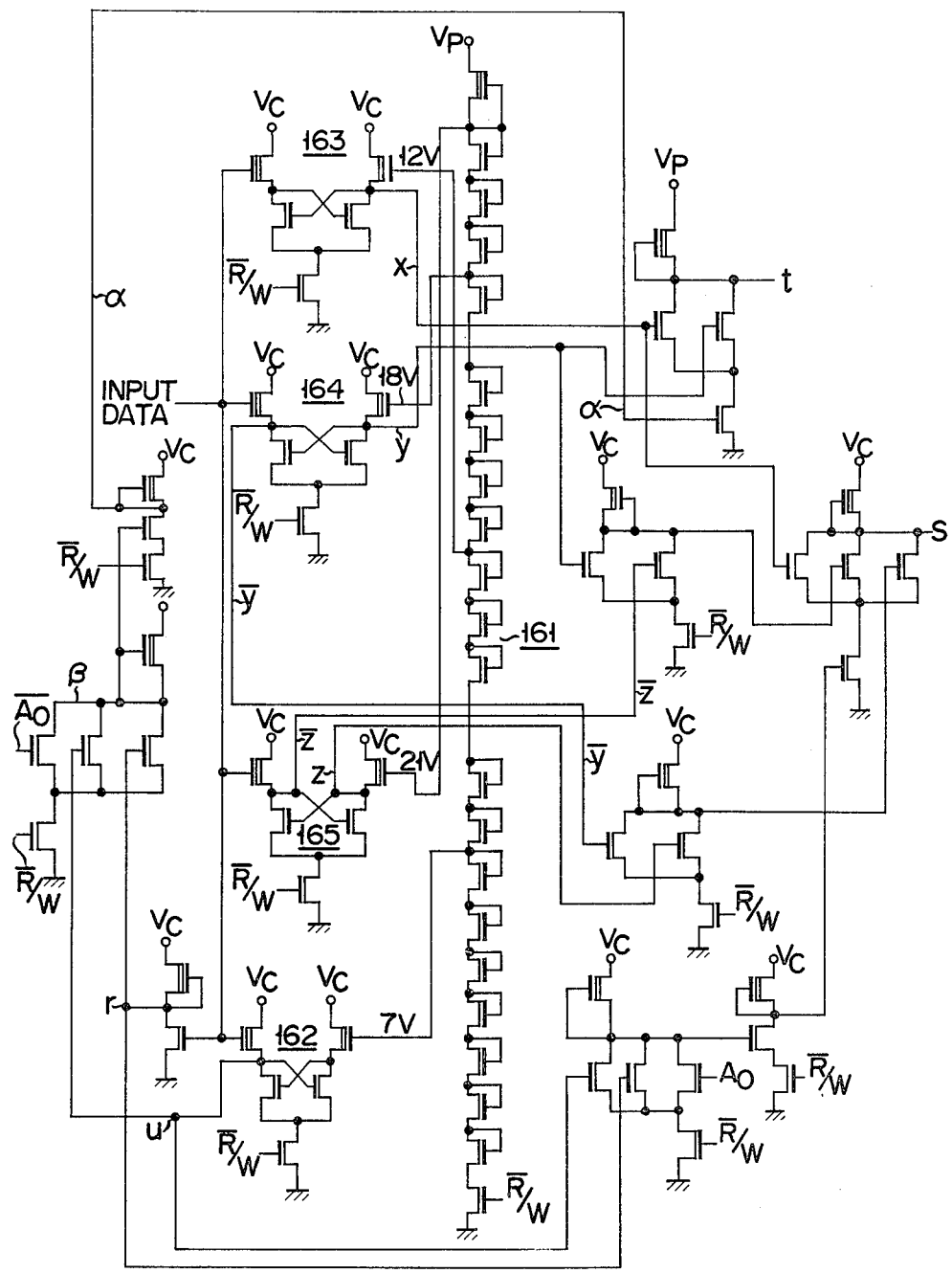

In FIG. 14, another arrangement of data input circuit 10b is shown. A reference voltage generating section 161 generates reference voltages of 7 V, 12 V, 18 V and 21 V. These reference voltages are compared with the input data voltage in the voltage comparator 162 to 165, respectively. This circuit can write 1 into one memory cell selected by address signals when the input data is at 5 V. When the input data is at 10 V, 15 V, 20 V or 25 V, a pair of memory cells having different addresses can be simultaneously programmed. Further, two-bit program data can be applied to two memory cells at the same time.

The circuit of FIG. 14 operates according to Table 3 given below.

TABLE 3

| Input data | x | y | z | u | α | β | γ | s | t |
|---|---|---|---|---|---|---|---|---|---|
| 0 V | 1 | 1 | 1 | 0 | 1 | 0 | 1 | 0 | 0 |
| 5 V | 1 | 1 | 1 | 0 | ✻ | ✻ | 0 | ✻ | ✻ |
| 10 V | 1 | 1 | 1 | 1 | 1 | 0 | 0 | 0 | 0 |
| 15 V | 0 | 1 | 1 | 1 | 1 | 0 | 0 | 1 | 0 |
| 20 V | 0 | 0 | 1 | 1 | 1 | 0 | 0 | 0 | 1 |
| 25 V | 0 | 0 | 0 | 1 | 1 | 0 | 0 | 1 | 1 |

Particulars of the symbol ✻ in Table 3 are as follows:

|  | α | β | γ | s | t |
|---|---|---|---|---|---|
| when A0 = 0 | 1 | 0 | 0 | 1 | 0 |
| when A0 = 1 | 0 | 1 | 0 | 0 | 1 |

More specifically, when the input data is at 5 V and A0=0, in the circuit of FIG. 12, FET 9b turns on so that data 1 is written into one of the memory cells connected to the column lines 2ob, . . . , 2mb. On the other hand, when A0=1, FET 9a turns on so that data 1 is loaded into one of the memory cells connected with the column lines 2oa, . . . , 2ma.

When the input data is at 10 V, since s=t=0, data 0 is written into a couple of the memory cells connected to two column lines selected by column decoder 8a and to a row line selected by row decoder 4a. When the input data is at 15 V, since s=1 and t=0, data 1 is written into one of the memory cells connected to column lines 2ob, . . . , 2mb, and data 0 is written into one of the memory cells connected to column lines 2oa, . . . , 2ma. When the input data is at 20 V, since s=0 and t=1, data 1 is written into one of the memory cells connected with column lines 2oa, . . . , 2ma, and data 0 is written into one of the memory cells connected with column lines 2ob, . . . , 2mb. And when the input data is at 25 V, since s=t=1, data 1 is written into a pair of memory cells concurrently.

In this case, as stated above, program data can be applied to a plurality of memory cells at the same time. Therefore, a data latch time is not necessary. In the memory shown in FIG. 12, a memory area corresponding to 1 output bit is divided into two groups. Therefore, the programming time is halved compared with that of the prior art. Generally, if the memory area is divided into n groups, the programming time is reduced to 1/n of that of the prior art. And in this case, the input data has $2^n$ voltage levels.

The number of the aforesaid gate signals Y1, Y2 is not limited to two, but may be three or more. The signals Y1, Y2 may be supplied through input pads. Alternatively, input signals (for example, address input signals) may be used for the signals Y1, Y2. While the cases where the present invention is applied to a ROM have been described, the present invention is also applicable to a RAM (random access memory). Namely, also in a read/write RAM memory cells having different addresses can be selected and written simultaneously by using a special signal according to the teachings described in connection with the illustrated embodiments of this invention. Further, although the embodiments of this invention were described in connection with 1 word×4 bit memory, this invention may be applied to 1 word×1 bit memory or 1 word×8 bit memory.

What we claim is:

1. A semiconductor memory comprising:
   a memory array with a plurality of semiconductor memory cells arranged in a matrix form having column lines and row lines, and 1 or more bit outputs, a plurality of column lines being associated with each bit output;
   column and row decoders responsive to address signals to select a memory cell associated with each of the bit outputs;
   data input circuit means for writing data into a memory cell which is associated with each of the bit outputs and selected by said column and row decoders;
   a program voltage source; and
   a plurality of switching transistors connecting, when enabled, said plurality of column lines to said program voltage source, said switching transistors being grouped into first transistors and second transistors, said first transistors being enabled by a first gate signal and said second transistors being enabled by a second gate signal, so that a plurality of memory cells is simultaneously programmed for program testing, said plurality of memory cells being connected to column lines to which a program voltage is applied and to one row line selected by said row decoder.

2. A semiconductor memory operable during a normal memory operation and a program testing operation comprising:
   a memory array with a plurality of semiconductor memory cells arranged in a matrix form having column lines and row lines and 1 or more bit outputs, a plurality of column lines being associated with each of said bit outputs and said plurality of column lines being divided into a plurality of groups;
   column and row decoders responsive to address signals to select a memory cell which is associated with each of said bit outputs;

data input circuit means for writing data into a plurality of memory cells, each of which is associated with each of said bit outputs and selected by said row and column decoders; and means responsive during normal memory operation to two of said address signals representing complementary states of a bit of an address formed by said address signals but which are made to the same level during program testing operation, to cause said data input circuit means to apply program data to corresponding column lines selected by said column decoder in different column line groups;

whereby memory cells are simultaneously programmed for program testing said memory cells being connected to corresponding column lines in different column line groups selected by said column decoder and to a row line selected by said row decoder.

3. A semiconductor memory comprising:

a memory array having a plurality of memory cells arranged in a matrix form having column lines and row lines and one bit output or bit outputs, a plurality of column lines being associated with each bit output;

column and row decoders responsive to address signals to select a memory cell associated with each of bit outputs;

data input circuit means for writing data into a memory cell which is associated with each of bit outputs and selected by said column and row decoders; and means responsive to a control signal for simultaneously applying a program voltage to a plurality of column lines and a plurality of row lines;

whereby a plurality of memory cells are simultaneously programmed, which are connected to said plurality of column lines and said plurality of row lines which are supplied with the program voltage.

4. A semiconductor memory comprising:

a plurality of memory arrays, each having a plurality of memory cells arranged in a matrix form with column lines and row lines and a plurality of bit outputs;

decode means responsive to first address signals to select corresponding memory cells in a plurality of said memory arrays;

a plurality of data write circuits coupled to said memory arrays for writing data into corresponding memory arrays;

a write-circuit selecting circuit responsive to second address signals to select one of said write circuits to write data into a corresponding memory array; and means responsive to a control signal to modify said second address signals so as to cause said write-circuit selecting circuit to simultaneously select a plurality of said memory arrays.

5. A semiconductor memory according to claim 4, in which said decode means comprises column and row decoders provided for each of said memory arrays.

6. A semiconductor memory comprising:

a memory array having a plurality of memory cells arranged in a matrix form with column lines and row lines and a plurality of bit outputs, a plurality of said column lines being associated with each of said bit outputs and divided into a plurality of groups;

column and row decoders responsive to address signals to select corresponding column lines in different column line groups associated with each bit output and a row line;

a program power source;

a plurality of switching means for, when enabled, connecting each of said column line groups to said program power source;

data input circuit means responsive to input data having more than two voltage levels to selectively control said plurality of switching means, whereby data are simultaneously written into memory cells connected to column lines selected by said column decoder and a row line selected by said row decoder, said input data being data written into a plurality of memory cells having a plurality of addresses according to different voltage levels.

7. A semiconductor memory according to claim 6, in which the number of the voltage levels of said input data is $2^n$ when the number of the column line groups for one bit output is n.

8. A semiconductor memory according to claim 3 or 4, wherein said control signal includes address signals which are made to be in-phase for program testing.

9. A semiconductor memory according to claim 1, 2, 4, or 6, in which each of said memory cells is a floating-gate type MOS transistor having its gate connected to a row line and its drain connected to a column line.

* * * * *